MULTILAYER THICK FILM CERAMIC HYBRID INTEGRATED CIRCUIT

Filed June 7, 1968

INVENTORS
HENRY FENSTER
JACK D. DALE

BY Melvin Pearson Williams
ATTORNEY

United States Patent Office 3,576,668
Patented Apr. 27, 1971

3,576,668

MULTILAYER THICK FILM CERAMIC HYBRID INTEGRATED CIRCUIT

Henry Fenster, Wyndmoor, and Jack D. Dale, Warminster, Pa., assignors to United Aircraft Corporation, East Hartford, Conn.

Filed June 7, 1968, Ser. No. 735,279
Int. Cl. B44d *1/18*
U.S. Cl. 117—212 3 Claims

ABSTRACT OF THE DISCLOSURE

Multiple layers of printed conductors are interleaved with layers of printed glassy insulator (or dielectric) so as to provide a greatly expanded circuit capability on a single substrate.

BACKGROUND OF THE INVENTION

Field of art

This invention relates to screen printed (thick film) integrated circuitry, and more particularly to a circuit employing multiple layers of glass insulated conductors and a method for producing same.

Description of the prior art

The art of forming integrated circuitry on ceramic substrates has been fairly well developed. In this art, a ceramic wafer is utilized as the underlying substrate upon which circuitry is developed. Circuitry is formed by successive printing through well-known screen printing processes (such as that commonly referred to as "silk screening") with inks suitable to form insulators, conductors and resistors. For instance, one well-known form of thick film hybrid integrated circuit employs the printing of suitable conductors followed by superposing thereover the printing of suitable resistors, following which transistor and/or diode chips are mounted on the substrate and well-known wire bonding techniques are used to interconnect the transistors with the conductors and/or resistors so as to form a useful circuit. The substrate may then be mounted in a suitable package, and connection between the package leads and the substrate made by known wiring techniques. The process, as is known in the art, requires the making of a series of patterns on rubylith, following which photomasks are made, which masks are utilized to provide the patterns of inking on the screen for the screen printing process. Once the screens are made up, many circuits may be printed before the screen becomes consumed for useful purposes and a new screen must be made.

In an effort to improve the versatility of this art, multiple ceramic layers have been employed. One way of achieving this known to the art is the utilization of a fired ceramic substrate with conductors and/or resistors printed thereon, and the application thereto of a green ceramic wafer with resistors and/or conductors printed thereon, following which the two are fused into a single entity by firing in a kiln. Other techniques are known, such as the use of multiple fired ceramic wafers, one on top of the other, which are ultimately joined into a unitary mass so as to provide a multiple-layered ceramic circuit. Another known method includes utilizing a plurality of dry, thin ceramic wafers, each of which has conductors and/or resistors formed thereon, with holes penetrating the conductors and/or resistors suitably so as to permit interconnection with the various wafers, by means of a metallic paste, the assemblage being fired so as to volatilize all of the binders involved at one time, sintering the ceramic particles, and thereby forming a monolithic structure.

The utilization of screen printing techniques so as to provide thick film integrated circuitry has heretofore had the great advantage of utter simplicity, low capital outlay, and low cost for the individual circuits produced thereby. With the advent of the techniques known to the prior art for forming multiple-layered ceramic circuits, the advantages of the thick film art are lost due to the inherent high cost and difficulty in utilizing the multilayer techniques known in the art.

SUMMARY OF THE INVENTION

The object of the present invention is to provide a multilayered printed thick film circuit utilizing relatively low cost, reliable, simple production techniques.

In accordance with the present invention, layers of a glassy ceramic are printed over layers of conductors, the glassy ceramic layer being provided, ab initio, with holes therein in discreet spaces thereof where interconnection between two or more layers of conductors and/or resistors is desired; printing of each conductive layer includes printing within holes left in previous glass layers so as to make contact with other conductive and/or resistive layers.

The invention is particularly well suited to the provision of a large number of conductors so as to facilitate utilization of hybrid technology wherein silicon or other chips containing resistors and/or active devices of either the thin film or diffused variety may be suitably interconnected on a single hybrid substrate. The invention avoids the difficulties of pre-preparation of multiple substrates, and takes full advantage of all of the techniques available in the prior art relative to screen printed thick film integrated circuits.

The foregoing and other objects, features and advantages of the present invention will become more apparent in the light of the following detailed description of a preferred embodiment thereof, as illustrated in the accompanying drawing.

DESCRIPTION OF THE PREFERRED EMBODIMENT

Figures 1, 2, 3, 4, 5, 6:
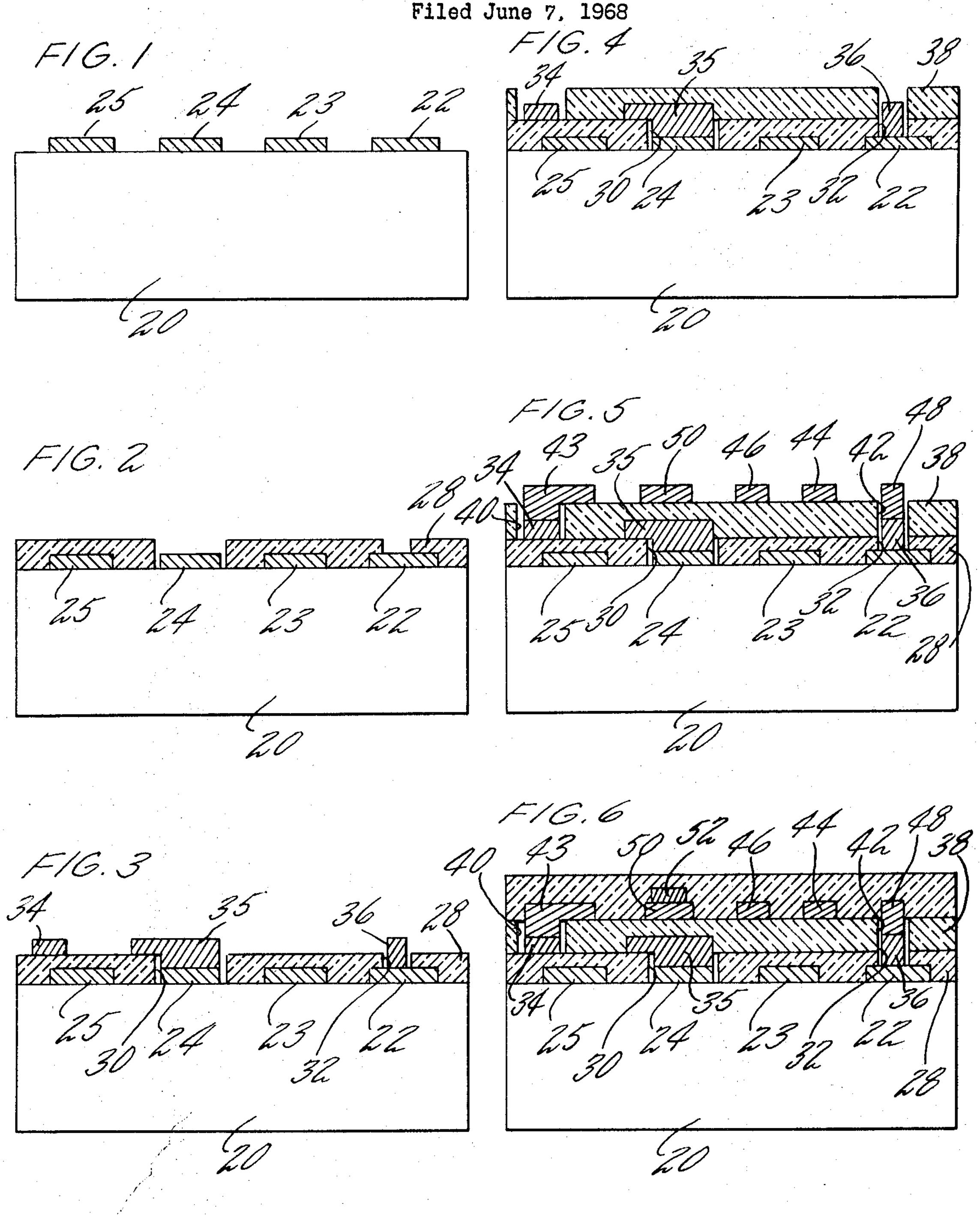
FIGS. 1–6 are sectioned elevations illustrating successive steps in the preparation of multilayer screen printed thick film integrated circuits, in accordance with the present invention.

Referring now to FIG. 1, a ceramic wafer 20 is the underlayment for an integrated circuit in accordance with the present invention. This wafer preferably consists of a fired ceramic, such as alumina. Wafers of this type may be purchased readily in the open market. The wafer is initially prepared by being cleaned with a detergent (of a type widely used in the semiconductor industry) or with methanol. Thereafter, a first layer of conductors (such as conductors 22–25) are printed in a suitable pattern. Printing of conductors may be accomplished in accordance with well-known printing techniques usually referred to as "screen printing." The ink used for the printing is available from a number of sources in the open market. It may consist, for instance, of a cermet gold glaze or a cermet platinum glaze, which glazes consist of particles of gold (or platinum, or other suitable metal), powdered glass, and an organic binder of a suitable type, in accordance with teachings known in the art. When this pattern has been printed, it is preferably dried so as to remove excess solvent therefrom so as to avoid having a high concentration of solvent during the kiln firing of the pattern. This may be achieved, for instance, at a temperature of 120° C. for about 15 minutes. Otherwise, it may be dried at room temperature for a suitably longer time, or otherwise as desired. Then the first conductor pattern layer is fired in a kiln so as to sinter the conductive pattern. This may be achieved at roughly 1,500° F. to 1,800° F. for a period of between 5 to 20 minutes. The ambient during this baking preferably contains oxygen, and regular room air has been found satisfactory. Following the firing of the first conductive pattern, a visual check for continuity (that is to see that the operation has proceeded properly) is preferably performed.

As illustrated in FIG. 2, the next step is to print a first glass layer over the first conductive layer, such as the glass layer 28. The printing pattern for this layer includes glass printed over the entire surface except in areas 30, 32 where inter-layer interconnections are required. This is one of the features of the present invention, in that the use of glass isolated multiple layers permits printing of glass only where it is required, and obviates the need for drilling, cutting or etching holes through an existing layer. The glass ink used during the printing may be any suitable sort of ceramic glaze, provided that it has sufficient dielectric and/or insulative qualities for the circuit being prepared. Additionally, the glass utilized, whenever an additional conductive and/or resistive layer is to be printed on top of the glass, should be of the devitrifying type: that is, it should not reflow when heated to its original firing temperature. Thus, once it is fired, this glass should remain intact and in the solid state during firing of subsequent layers on the circuit. In addition, the material used for the glass layer 28 should be chosen so as to provide a surface relatively free of pinholes since pinholes can ruin an entire circuit. Since the present invention is most advantageously utilized in complex circuitry having a large number of conductors and/or resistors, the location of pinholes can be very difficult. However, screen ink materials are available on the open market which will provide a glass layer 28 having very high dielectric constant, relatively low dissipation factor, very high resistance, and good voltage breakdown characteristics with practically no occurrence of pinholes.

In the printing of layer 28, it is aligned at the top of the conductive areas 22–25, but the printing process inherently allows sufficient interflow so as to suitably fill all of the areas between the conductors as well as on top of them.

The glass layer, once dried, is fired in a kiln at a temperature of 1,400 to 1,700° F. for from 5 to 10 minutes.

If desired, as may be the case if a pinhole problem exists with a given material chosen for other reasons, two steps of printing and drying may be utilized prior to firing of the glass. In other words, the glass layer 28 may consist of two printed layers one on top of the other, each separately dried followed by a firing to set both layers in a single monolithic lamination.

Another alternative is to print, dry and fire two glass layers separately so as to provide an improved layer 28 on the circuit wafer.

After the first glass layer has been provided over the first conductive layer, an inspection check is preferably performed to insure that the holes 30, 32 are suitably aligned over the conductive portions 24, 22, respectively, before proceeding with the circuit fabrication. In the event that misalignment has occurred in the establishing of the glass layer 28, then certain corrective measures may be taken, such as by scribing away a suitable amount of glass so as to provide adequate access to the conductive portions 30, 32. Otherwise, if corrective measures cannot be taken, then the wafer may be discarded without wasting further effort thereon.

The next step (FIG. 3) in the process is to print a second layer of conductive pattern in the same fashion as the first layer so as to provide conductive areas such as areas 34–36.

Notice that (as illustrated in FIG. 3) the second conductive pattern will in some cases correspond and interconnect with the first conductive pattern, such as is illustrated by area 35 which depicts a general conductor which transcends some portion of the second conductive pattern, and makes contact with area 24 through the hole 30. On the other hand, the area 34 is completely insulated from the first conductive layer, and the areas 25 and 23 are completely insulated from the second conductive layer. The area 36 is illustrative of pads which may be printed simply to make connection between layers, there being no conduction across the given layer but merely conduction through the layer. It is to be noted that the printing of the areas 34–36 takes place with the screen positioned at the top surface of the glass layer 28, but the printing process is such as to inherently permit not only printing areas (such as area 34 and part of area 35) on top of the glass layer 28 but to permit printing partly through the holes in the glass layer 28 so as to make contact with the first conductive layer (as is true in the case of area 36 contacting area 22 and area 35 contacting area 24). This is one of the features of the present invention: no special steps or manufacturing equipment is required in order to make inter-layer connections.

As illustrated in FIG. 4, the next step in the process is to provide any necessary additional layers of glass such as layer 38. This layer may be provided in accordance with the description hereinbefore relative to layer 28.

As an example herein, a final conductive layer (FIG. 5) includes conductor and/or resistor areas printed on top of the second glass layer and in some cases making contact with the second conductive layer. As an example, the glass layer 38 is illustrated as including holes 40, 42 (which are established by the pattern of printing used to cover the entire assembly except where holes are desired) so as to permit making contact with conductive areas 34 and 36, respectively. For instance, two printing operations may take place, one providing resistor areas such as 42 and 44, and the other providing conductive areas such as 46 and 48. In addition, a suitable pad 50 may be provided so as to permit mounting of a chip thereon. Such a chip may comprise a silicon chip including thin film or diffused resistors thereon, or including a diode or transistor or other active elements thereon, or any combination of these so as to form an integrated circuit. It is immaterial to the present invention the nature of the chip 52 which may be mounted on an upper layer of the assembly. Assuming that the uppermost layer as illustrated in FIG. 5 is the final layer of conductors, resistors and contact pads, then suitable mounting of chips and wiring bonding so as to interconnect with conductors and/or resistors on this layer, and through interconnects (such as provided by the hole 40 and the holes 32, 42) to other layers in the circuit, as well as external contact conductors can be made. Thereafter, the entire top layer may be encapsulated (FIG. 6) by the printing thereon of a vitrifying insulator such as a soft glass which may be fired at a sufficiently low temperature so as not to alter the characteristics of the resistor areas 42, 44 nor to hurt any component within the chip 52 mounted thereon. For simplicity, the wiring has been eliminated from the illustration herein (as shown in FIG. 6) since such techniques are well-known in the semiconductor and microcircuit arts and are not a part of the present invention.

Although the invention has been shown and described with respect to a preferred embodiment thereof, it should be understood by those skilled in the art that various changes and omissions in the form and detail thereof may be made therein without departing from the spirit and the scope of the invention, which is to be limited and defined only as set forth in the following claims.

Having thus described a typical embodiment of our invention, that which we claim as new and desire to secure by Letters Patent of the United States is:

1. In the method of forming a multilayer, screen-printed, integrated circuit, the steps of:

providing a ceramic substrate;

printing a first conductive layer in a pattern on a surface of said substrate;

drying and firing said first conductive pattern;

printing a devitrifying insulating layer in a pattern over substantially the entire surface of said substrate and said conductive pattern, said insulating pattern including holes at discreet areas of said conductive pattern to which contact from a subsequent conductive layer is desired;

drying and firing said insulating pattern;

printing a second layer of conductive material in accordance with a pattern, said second conductive layer flowing through holes in said insulating layer so as to make contact with said first conductive layer; and drying and firing said second conductive layer.

2. The method according to claim 1 including the additional step of:

printing a solid pattern of a vitrifying glass over the second layer of conductive material.

3. The method according to claim 1 including the additional step of:

printing a pattern of resistive material over the second layer of conductive material.

References Cited

UNITED STATES PATENTS

| | | | |
|---|---|---|---|
| 3,040,213 | 6/1962 | Byer et al. | 317—101(B) |
| 3,312,871 | 4/1967 | Seki et al. | 317—101(A) |
| 3,317,653 | 5/1967 | Layer, Jr., et al. | 117—217X |
| 3,370,262 | 2/1968 | Marty et al. | 117—217X |
| 3,477,872 | 11/1969 | Amick | 117—217X |

ALFRED L. LEAVITT, Primary Examiner

K. P. GLYNN, Assistant Examiner

U.S. Cl. X.R.

117—38, 45, 217